(12) United States Patent
Chiang

(10) Patent No.: US 12,341,067 B2
(45) Date of Patent: Jun. 24, 2025

(54) MANUFACTURING METHOD OF SEMICONDUCTOR DEVICE

(71) Applicant: UNITED MICROELECTRONICS CORP., Hsin-Chu (TW)

(72) Inventor: Meng-Ting Chiang, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 434 days.

(21) Appl. No.: 17/521,881

(22) Filed: Nov. 9, 2021

(65) Prior Publication Data

US 2023/0130654 A1    Apr. 27, 2023

(30) Foreign Application Priority Data

Oct. 22, 2021  (CN) .......................... 202111230639.5

(51) Int. Cl.
| | |
|---|---|
| *H01L 21/78* | (2006.01) |
| *H01L 21/268* | (2006.01) |
| *H01L 23/544* | (2006.01) |
| *H01L 29/20* | (2006.01) |
| *H10D 62/85* | (2025.01) |

(52) U.S. Cl.
CPC ............ *H01L 21/78* (2013.01); *H01L 21/268* (2013.01); *H01L 23/544* (2013.01); *H01L 2223/5446* (2013.01); *H10D 62/8503* (2025.01)

(58) Field of Classification Search
CPC ... H01L 29/2003–207; H01L 21/02389; H01L 21/18–326; H01L 2221/68304; H01L 2221/68327; H01L 2221/68354; H01L 21/78–786; H01L 23/562; H01L 23/544; H10D 89/011–013; H10D 62/8503
See application file for complete search history.

(56) References Cited

U.S. PATENT DOCUMENTS

| | | | |
|---|---|---|---|
| 7,642,631 B2 | 1/2010 | Lu | |
| 10,672,661 B2 | 6/2020 | Zundel | |
| 2015/0079761 A1* | 3/2015 | Lei | .......... H01L 23/544 |
| | | | 438/462 |
| 2015/0249133 A1* | 9/2015 | Yanase | .................... H01L 21/78 |
| | | | 257/77 |
| 2017/0069535 A1* | 3/2017 | Masuko | ............ H01L 29/66462 |
| 2017/0287846 A1* | 10/2017 | Dias | .......... H01L 24/94 |

(Continued)

*Primary Examiner* — Julio J Maldonado
*Assistant Examiner* — Stanetta D Isaac
(74) *Attorney, Agent, or Firm* — Winston Hsu

(57) ABSTRACT

A manufacturing method of a semiconductor device includes the following steps. A semiconductor structure including a substrate, a gallium nitride layer, semiconductor device units, and a scribe line region is provided. The gallium nitride layer is disposed on a first surface of the substrate. The semiconductor device units and the scribe line region are disposed on the gallium nitride layer. The scribe line region is located between the semiconductor device units. A trench is formed at a second surface of the substrate. The trench is formed corresponding to the scribe line region in a vertical direction. The trench penetrates through at least a part of the substrate in the vertical direction. A metal layer is formed on the substrate after the trench is formed. A cutting process is performed to the semiconductor structure after the metal layer is formed for separating the semiconductor device units from one another.

19 Claims, 8 Drawing Sheets

(56) References Cited

U.S. PATENT DOCUMENTS

2018/0337228 A1* 11/2018 Chang .................. H01L 23/562
2020/0286735 A1    9/2020 Carney
2023/0095477 A1*  3/2023 Kato ................... H10D 89/013
                                                              438/463

* cited by examiner

MANUFACTURING METHOD OF SEMICONDUCTOR DEVICE

BACKGROUND OF THE INVENTION

1. Field of the Invention

The present invention relates to a manufacturing method of a semiconductor device, and more particularly, to a manufacturing method of a semiconductor device including a cutting process.

2. Description of the Prior Art

In today's society, micro-processor systems composed of integrated circuits (IC) have been widely used in all aspects of life, such as household appliances, mobile communication equipment, PCs, etc., all have integrated circuits. Generally, the integrated circuits are formed with dies produced by semiconductor manufacturing processes. The manufacturing process of a die begins with the production of a wafer. Firstly, a plurality of areas are defined on a wafer, and various semiconductor processes such as deposition, lithography, etching or planarization process are performed to each area for forming various required circuits. Subsequently, a cutting process is performed to each area on the wafer for forming the dies, and the dies may be packaged or/and connected with other integrated circuit structures for forming the required semiconductor devices. Therefore, the process yield of the above-mentioned cutting process will directly affect the manufacturing cost of the product.

SUMMARY OF THE INVENTION

It is one of the objectives of the present invention to provide a manufacturing method of a semiconductor device. A trench is formed at a backside of a substrate and formed corresponding to a scribe line region before performing a cutting process, and a metal layer is formed on the backside of the substrate after the step of forming the trench and before the cutting process for improving related problems of the cutting process and enhancing the manufacturing yield.

According to an embodiment of the present invention, a manufacturing method of a semiconductor device is provided. The manufacturing method includes the following steps. A semiconductor structure is provided. The semiconductor structure includes a substrate, a gallium nitride layer, a plurality of semiconductor device units, and a scribe line region. The substrate has a first surface and a second surface opposite to the first surface in a vertical direction. The gallium nitride layer is disposed on the first surface of the substrate. The semiconductor device units are disposed on the gallium nitride layer. The scribe line region is disposed on the gallium nitride layer and located between the semiconductor device units. A trench is formed at the second surface of the substrate. The trench is formed corresponding to the scribe line region in the vertical direction, and the trench penetrates through at least a part of the substrate in the vertical direction. A metal layer is formed on the substrate after the trench is formed. A cutting process is performed to the semiconductor structure after the metal layer is formed for separating the semiconductor device units from one another.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-5 are schematic drawings illustrating a manufacturing method of a semiconductor device according to a first embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4.

FIGS. 6-11 are schematic drawings illustrating a manufacturing method of a semiconductor device according to a second embodiment of the present invention, wherein FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, and FIG. 11 is a schematic drawing in a step subsequent to FIG. 10.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
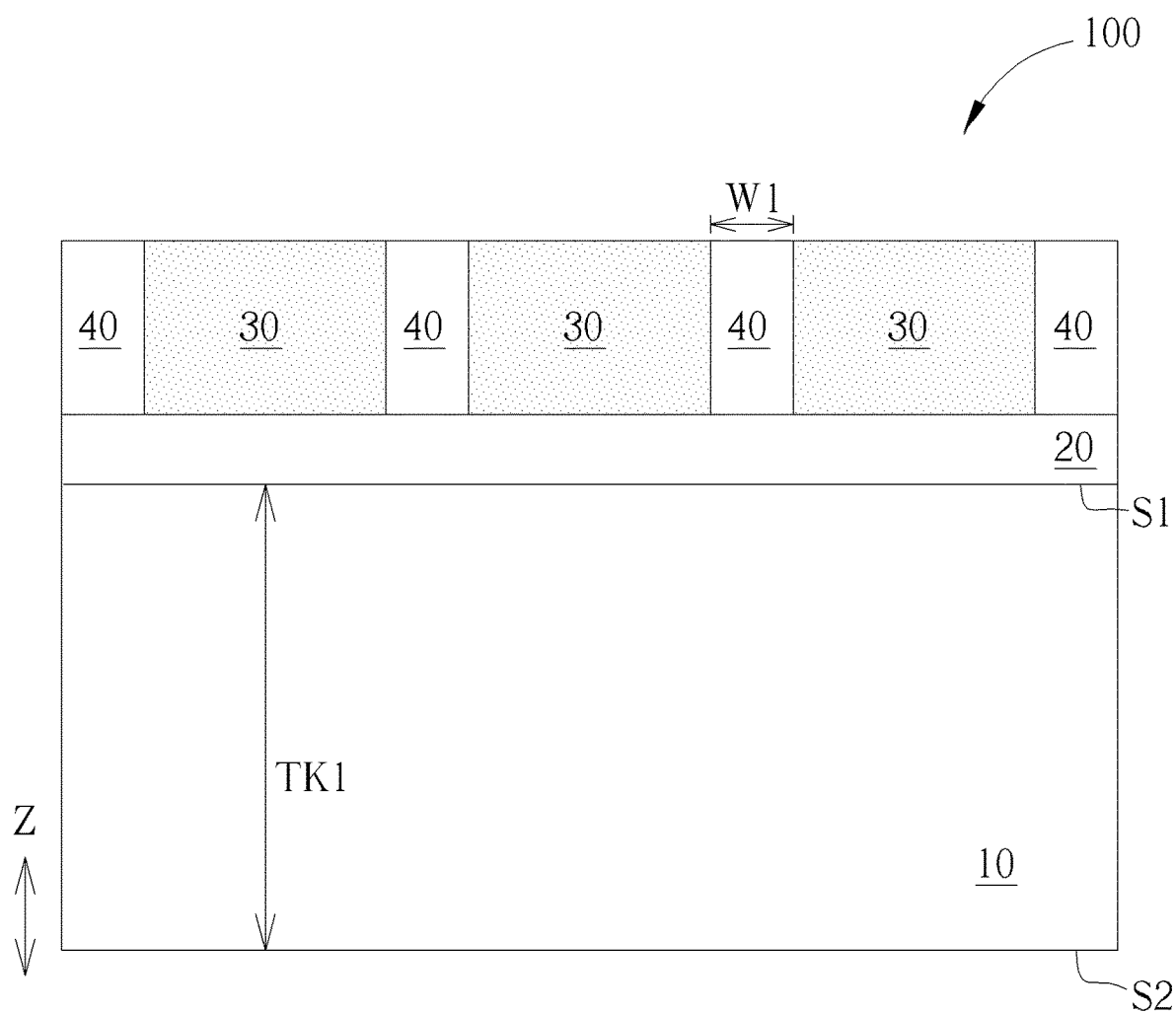
Figure 2:
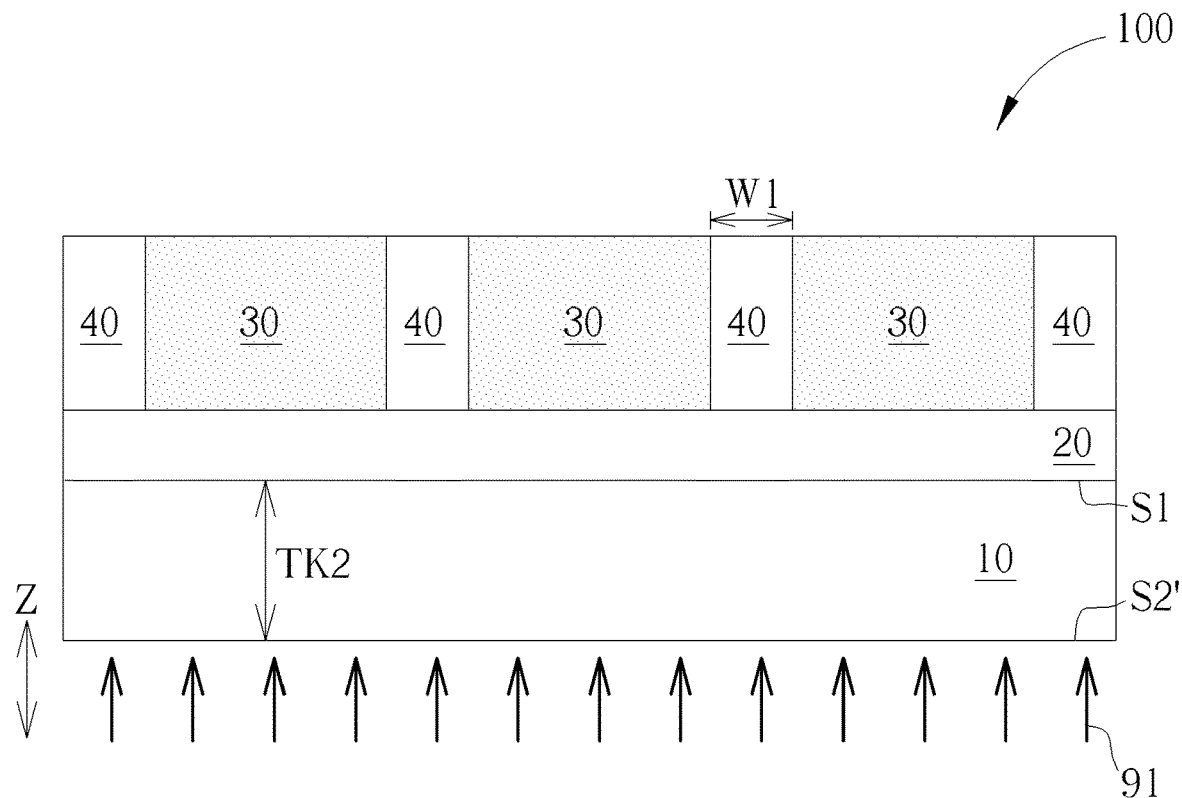
Figure 3:
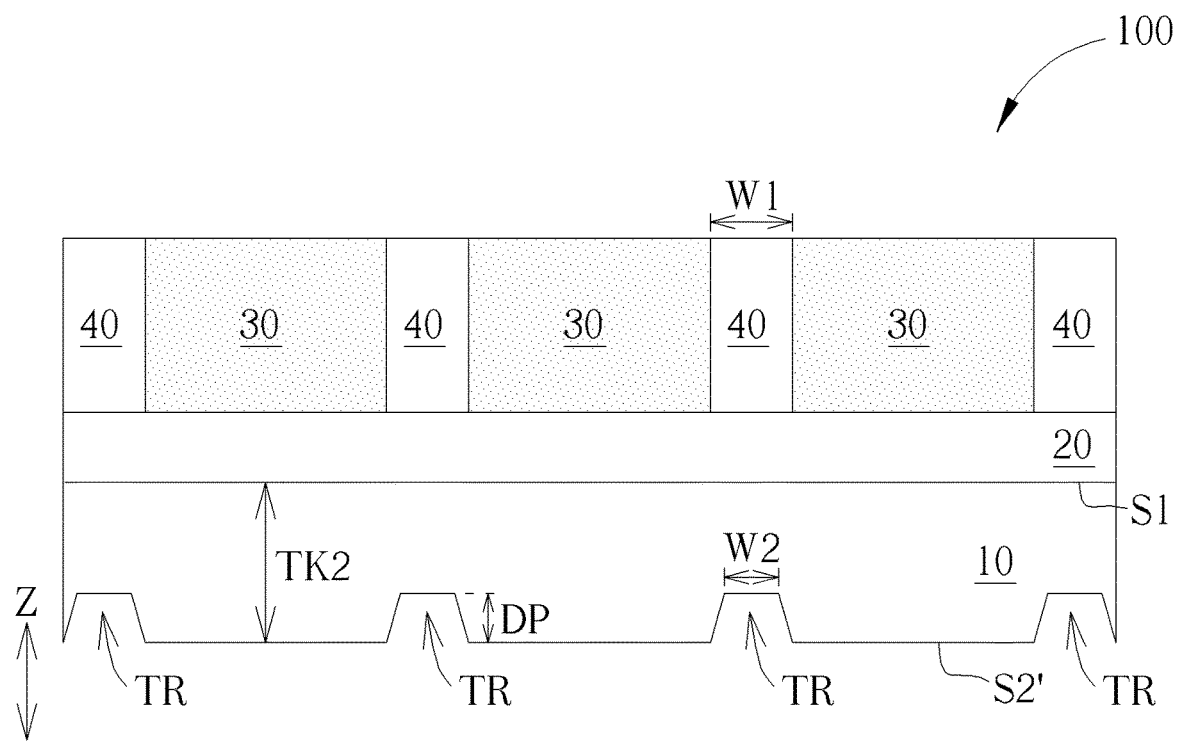
Figure 4:
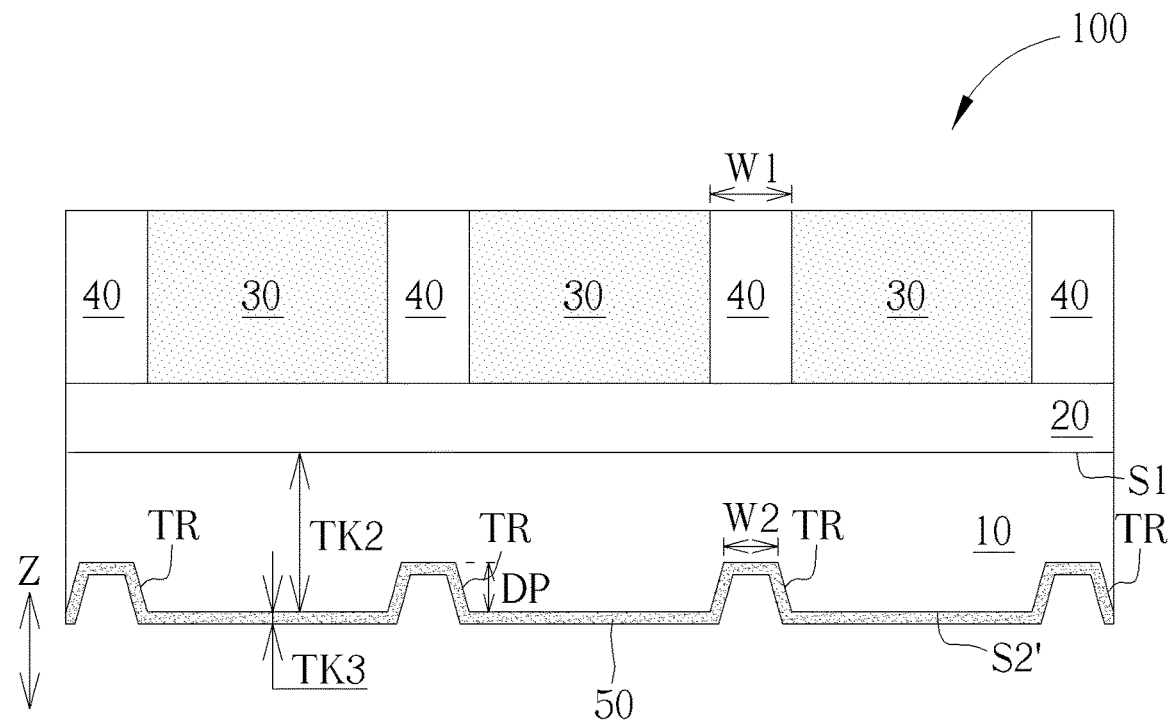
Figure 5:
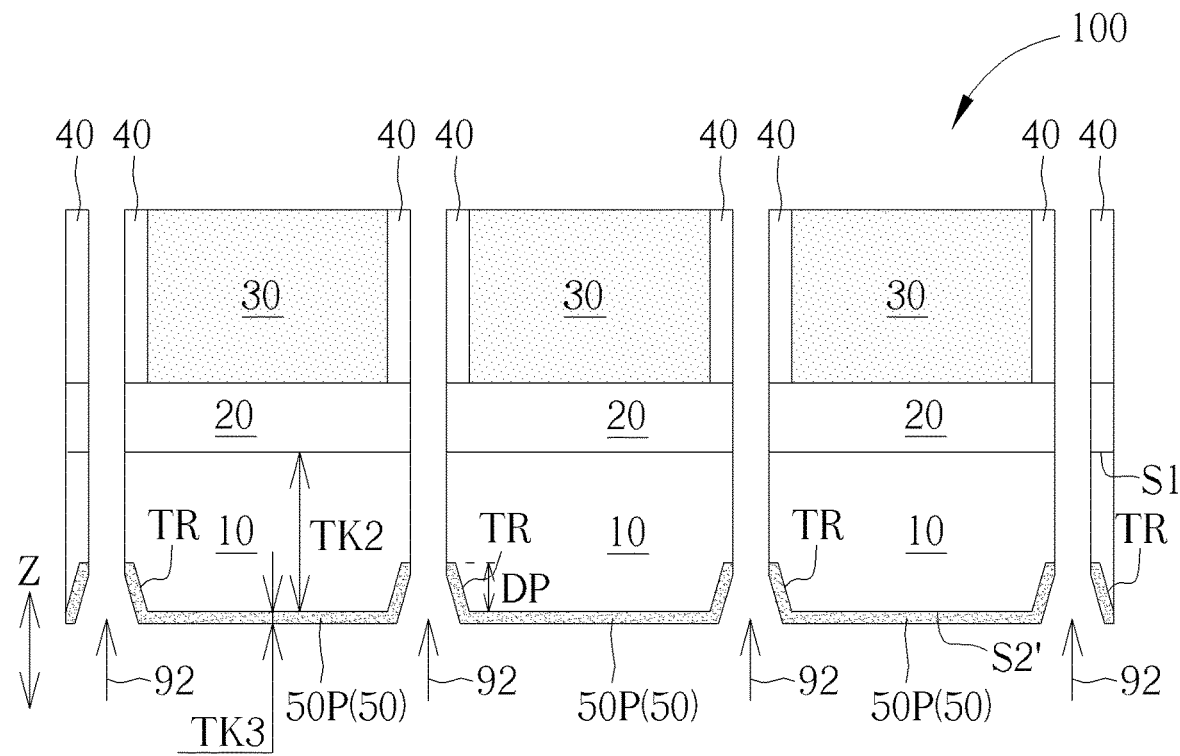

Please refer to FIGS. 1-5. FIGS. 1-5 are schematic drawings illustrating a manufacturing method of a semiconductor device according to a first embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4. The manufacturing method of the semiconductor device is provided in this embodiment and includes the following steps. Firstly, as shown in FIG. 1, a semiconductor structure 100 is provided. The semiconductor structure 100 includes a substrate 10, a gallium nitride layer 20, a plurality of semiconductor device units 30, and a scribe line region 40. The substrate 10 has a first surface (such as a surface S1 illustrated in FIG. 1) and a second surface (such as a surface S2 illustrated in FIG. 1) opposite to the first surface in a vertical direction Z. The gallium nitride layer 20 is disposed on the surface S1 of the substrate 10. The semiconductor device units 30 are disposed on the gallium nitride layer 20. The scribe line region 40 is disposed on the gallium nitride layer 20 and located between the semiconductor device units 30. In some embodiments, the vertical direction Z may be regarded as a thickness direction of the substrate 10, the surface S1 may be regarded as a front side surface of the substrate 10, the surface S2 may be regarded as a backside surface of the substrate 10, and the gallium nitride layer 20, the semiconductor device units 30, and the scribe line region 40 may be located at a side of the surface S1 of the substrate 10.

In some embodiments, the substrate 10 may include a silicon substrate, a silicon germanium semiconductor substrate, or a substrate made of other suitable materials. The gallium nitride layer 20 may include an un-doped gallium nitride layer, or other III-V compound material layers including gallium nitride. The semiconductor device unit 30 may include an active component, a passive component, an interconnection structure, a protection layer, and/or other required structures. The active component and the passive component described above may include but are not limited to transistors, diodes, capacitors, resistors, and so forth, and the interconnection structure may include an interlayer dielectric layer and electrically conductive layers and electrically conductive plugs disposed therein for being electrically connected with the active component and/or the passive component. The interlayer dielectric layer and the protection layer described above may include dielectric materials, such as silicon oxide, silicon nitride, silicon oxynitride, low dielectric constant (low-k) dielectric material, or other suitable dielectric materials. The electrically conductive layers and the electrically conductive plugs described above may respectively include electrically conductive materials, such as tungsten, aluminum, copper, titanium aluminide, titanium, titanium nitride, tantalum, tantalum nitride, titanium aluminum oxide, or other suitable electrically conductive materials.

In some embodiments, semiconductor components in the semiconductor device unit 30 disposed on the gallium nitride layer 20 may include III-V compound semiconductor components, such as a high electron mobility transistor (HEMT) formed with III-V compound semiconductor materials, and the gallium nitride layer 20 may be regarded as a buffer layer for forming the III-V compound semiconductor components. Therefore, the gallium nitride layer 20 may be an un-doped gallium nitride layer, but not limited thereto. In some embodiments, the scribe line region 40 located between the semiconductor device units 30 adjacent to each other may include an insulation material, a process condition monitoring structure, and/or other dummy circuits, and each of the semiconductor device units 30, the corresponding portion of the gallium nitride layer 20, and/or the corresponding portion of the substrate 10 may be regarded as a semiconductor die or a semiconductor chip unit, but not limited thereto.

As shown in FIG. 1 and FIG. 2, in some embodiments, a thinning process 91 may be performed to the substrate 10 for reducing the thickness of the substrate 10. For example, the thinning process 91 may be performed to the surface S2 of the substrate 10 for reducing the thickness of the substrate 10 (a thickness TK1 of the substrate 10 shown in FIG. 1 may be reduced to be a thickness TK2 of the substrate 10 shown in FIG. 2 accordingly, for instance). In some embodiments, the thickness TK1 may be about 1000 micrometers, and the thickness TK2 may be about 230 micrometers, but not limited thereto. After the thinning process 91, the surface S2 of the substrate 10 may become a surface S2', and the surface S2' may be regarded as a backside surface opposite to the surface S1 in the vertical direction Z. In some embodiments, the thinning process 91 may include a thinning approach with chemical mechanical polishing, an etching back approach, or other suitable physical thinning approaches and/or chemical thinning approaches.

As shown in FIG. 2 and FIG. 3, after the thinning process 91, one or a plurality of trenches TR may be formed at the surface S2' of the substrate 10. The trench TR may be formed corresponding to the scribe line region 40 in the vertical direction Z, and the trench TR may penetrate through at least a part of the substrate 10 in the vertical direction Z. For example, the trench TR may only penetrate through a portion of the substrate 10 adjacent to the surface S2' in the vertical direction Z, and a depth DP of the trench TR in the vertical direction Z may be less than the thickness TK2 of the substrate 10 in the vertical direction Z accordingly. In addition, the sidewall of the trench TR may be connected with the surface S2', and the trench TR may be regarded as a recess extending from the backside surface of the substrate (such as the surface S2') to the front side surface of the substrate 10 (such as the surface S1) in the vertical direction Z. In some embodiments, the bottom of the trench TR may be regarded as a portion with the shortest distance between the surface S1 and the trench TR, and the depth DP of the trench TR in the vertical direction Z may be regarded as a distance between the bottom of the trench TR and the surface S2' of the substrate 10 in the vertical direction Z. In some embodiments, the trench TR may be formed by a laser treatment, an etching treatment, or other suitable approaches performed to the substrate 10. The trench TR may be disposed corresponding to the scribe line region 40 in the vertical direction Z, and a bottom width of the trench TR (such as a width W2 shown in FIG. 3) may be less than or equal to a width of the scribe line region 40 located between two of the semiconductor device units 30 adjacent to each other (such as a width W1 shown in FIG. 3) for avoiding negative influence of the trench TR on the subsequent processes when the trench TR is too wide. In some embodiments, the width W1 described above may be regarded as a distance between two of the semiconductor device units 30 adjacent to each other, but not limited thereto.

As shown in FIG. 3 and FIG. 4, after the step of forming the trench TR, a metal layer 50 may be formed on the substrate 10, and the metal layer 50 may be used as a backside electrically conductive structure of the semiconductor device (such as a semiconductor power device), but not limited thereto. The metal layer 50 may be formed by evaporation, sputtering deposition, or other suitable approaches, and the metal layer 50 may a single layer or multiple layers of metallic material, such as titanium, nickel, silver, copper, or other suitable metallic materials. In some embodiments, a portion of the metal layer 50 may cover the surface S2' of the substrate 10, another portion of the metal layer 50 may be formed in the trench TR, and the trench TR is not fully filled with the metal layer 50. In some embodiments, a thickness of the metal layer 50 (such as a thickness TK3 shown in FIG. 4) may be less than the depth DP of the trench TR in the vertical direction Z for keeping the trench TR from being fully filled with the metal layer 50. The effect of keeping the stress damage to the metal layer 50 generated by the cutting process within the trench TR may be improved during the cutting process accordingly, and the negative influence on the metal layer 50 (such as a cracking issue and/or a peeling issue) formed on the surface S2' may be reduced accordingly.

As shown in FIG. 4 and FIG. 5, after the step of forming the metal layer 50, a cutting process 92 may be performed to the semiconductor structure 100 for separating the semiconductor device units 30 from one another and forming a plurality of semiconductor devices including the semiconductor device unit 30, the gallium nitride layer 20, the substrate 10, and a metal pattern 50P. A plurality of the metal patterns 50P separated from one another may be formed by the cutting process 02 performed to the metal layer 50. The cutting process 92 may include a saw blade cutting approach, a laser cutting approach, or other suitable cutting approaches, and the cutting process 92 may be performed at a site of the trench TR and/or a site of the scribe line region 40. For example, the cutting process 92 may be carried out at a single side of the semiconductor structure 100 (such as a side with the metal layer 50 formed thereon or a side adjacent to the scribe line region 40) or be carried out at both sides of the semiconductor structure 100. In addition, the negative influence of the cutting process 92 on the substrate 10 (such as warpage) may be improved and the negative influence of the cutting process 92 on the metal layer 50 formed on the surface S2' (such as the cracking issue and/or the peeling issue) may be reduced by forming the trench TR, controlling the width of the trench TR, and forming the metal layer 50 partially in the trench TR, and the purpose of enhancing the manufacturing yield may be achieved accordingly. In some embodiments, the manufacturing method described above may be regarded as introducing the step of forming the trench TR in to a backside grinding and backside metallization (BGBM) process for enhancing the manufacturing yield of the cutting process 92 and/or other related processes, but not limited thereto.

In some embodiments, the thinning process, the step of forming the trench TR, and the step of forming the metal layer 50 described above may be carried out after bonding a carrier substrate (not illustrated) to the front side of the semiconductor structure 100 (such as a side relatively closer to the semiconductor device units 30) according to some design considerations, and the carrier substrate may be removed before the cutting process 92 described above, but not limited thereto.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 6:
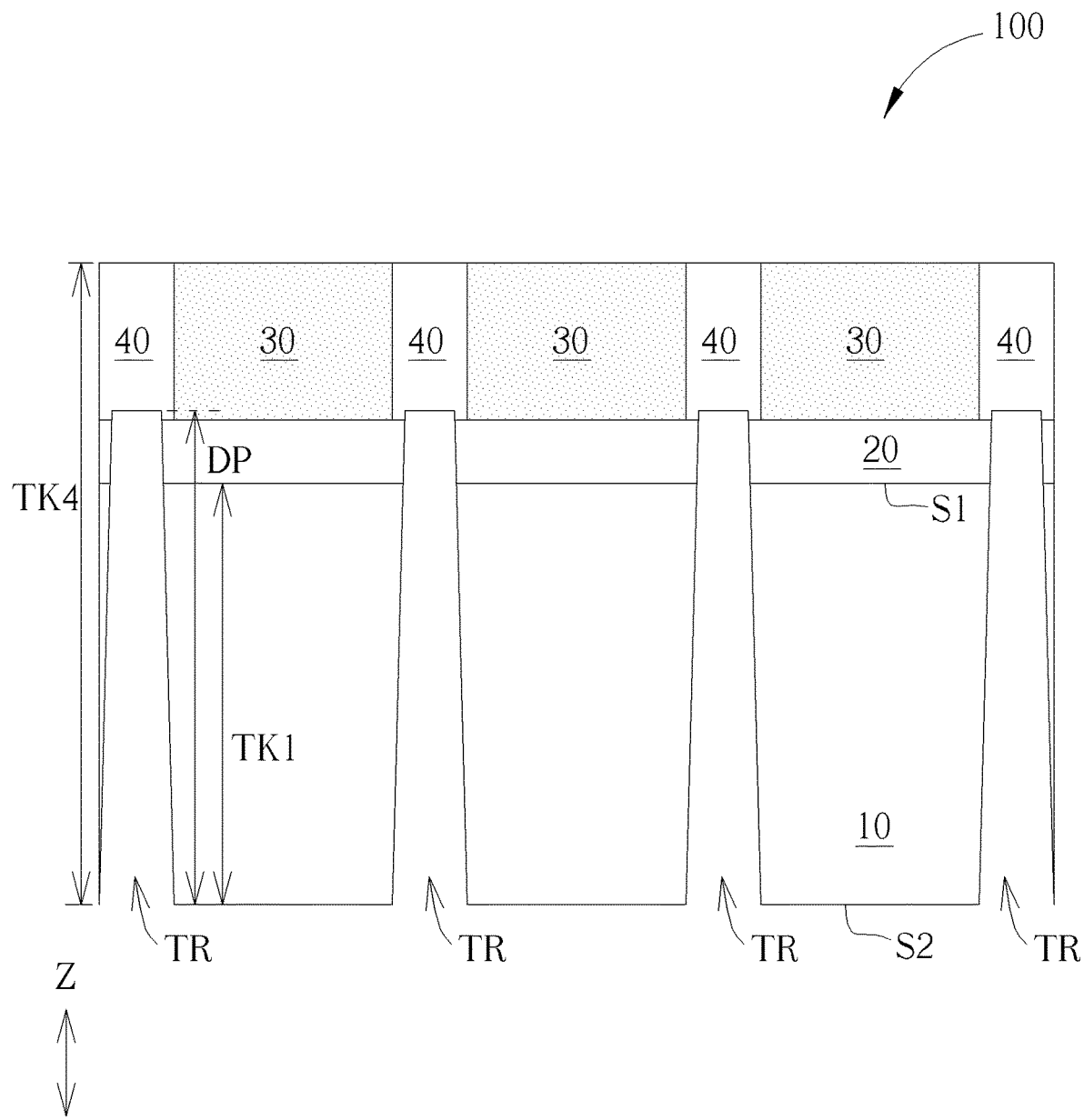
Figure 7:
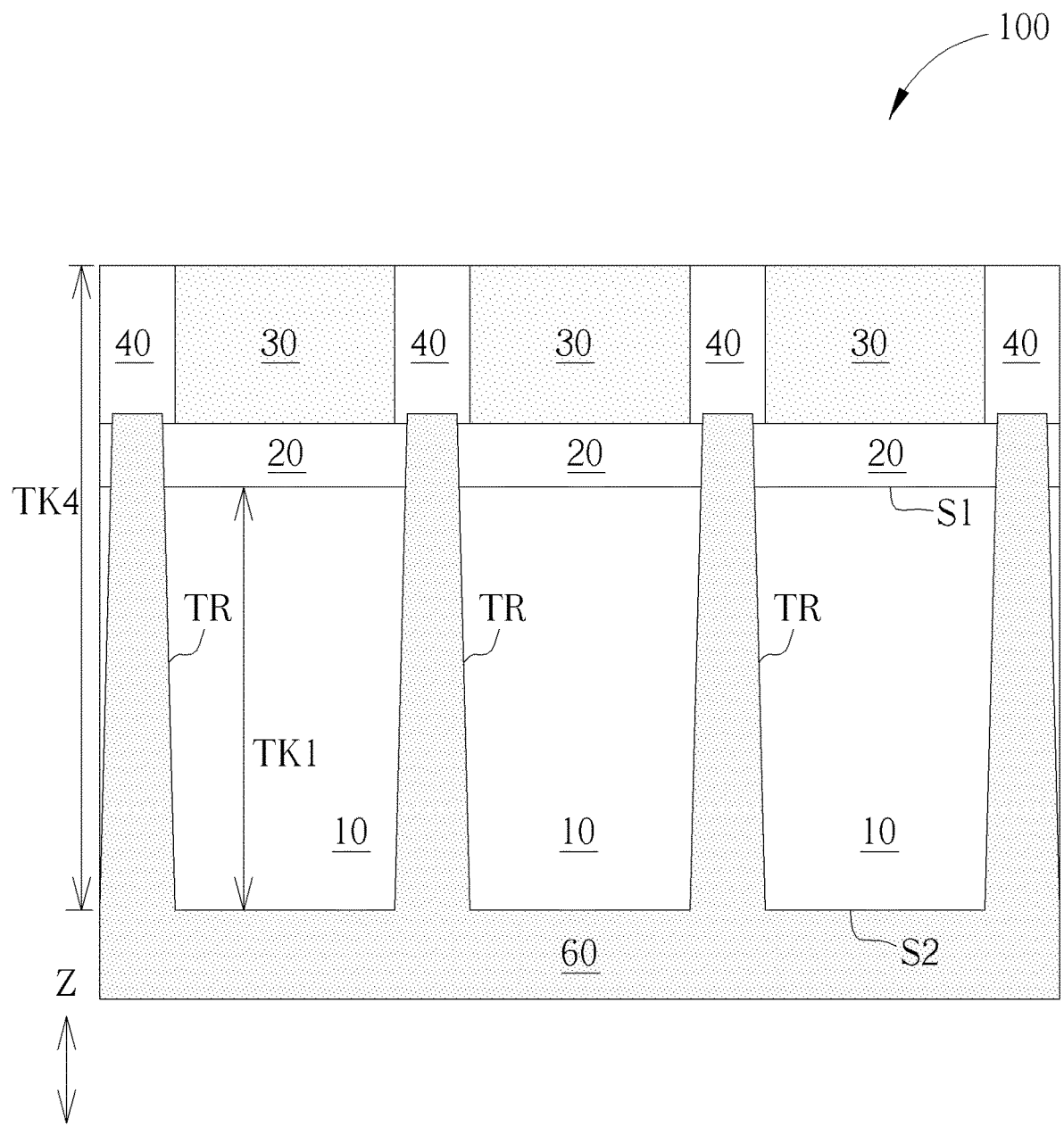
Figure 8:
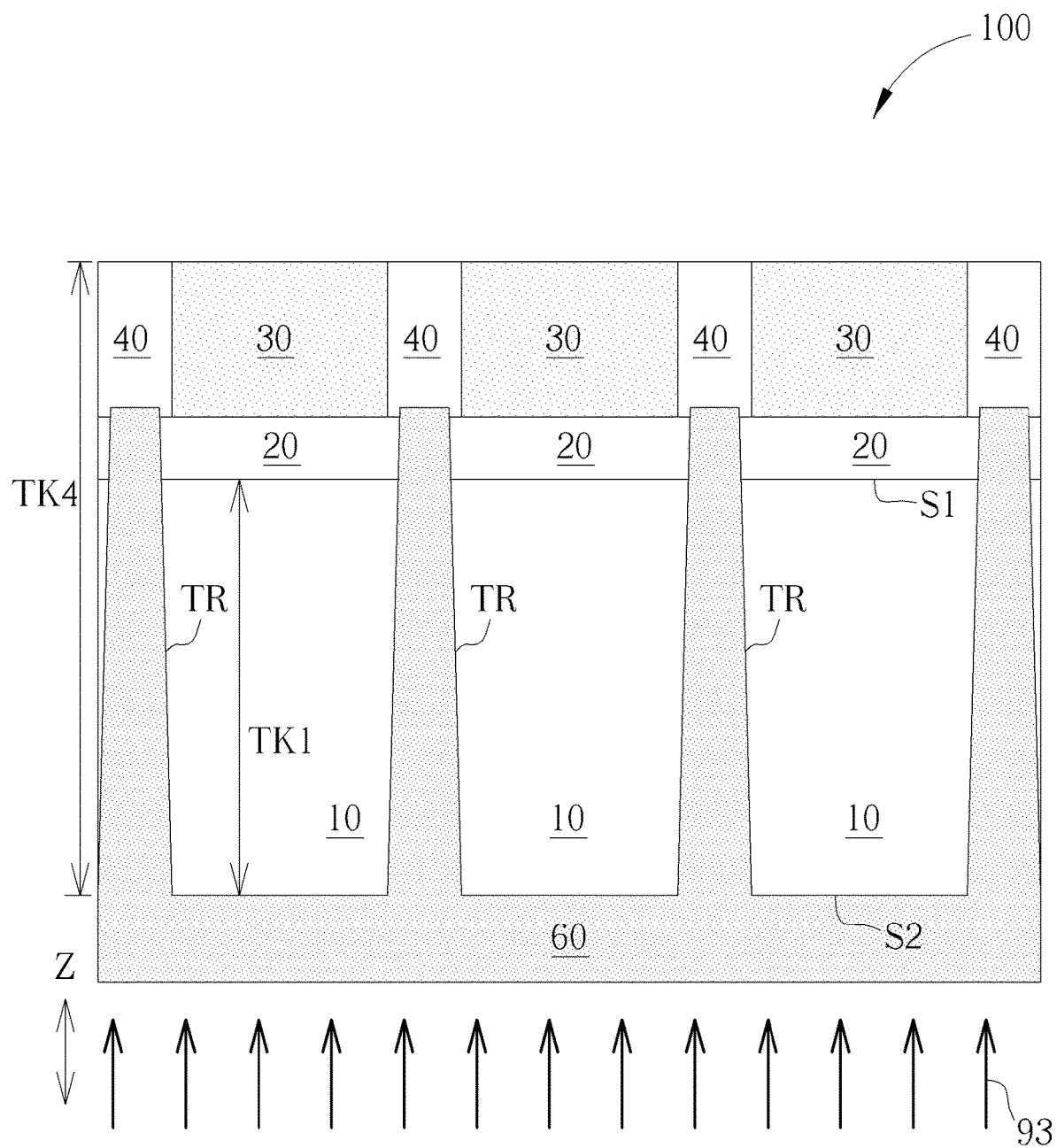
Figure 9:
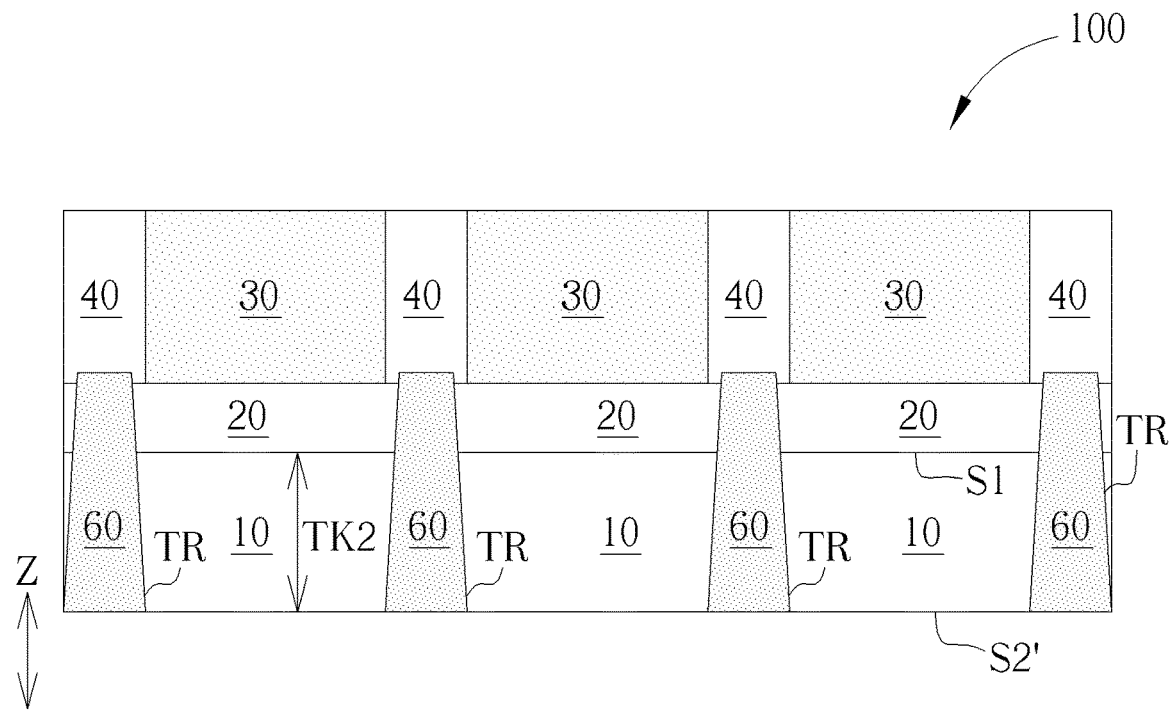
Figure 10:
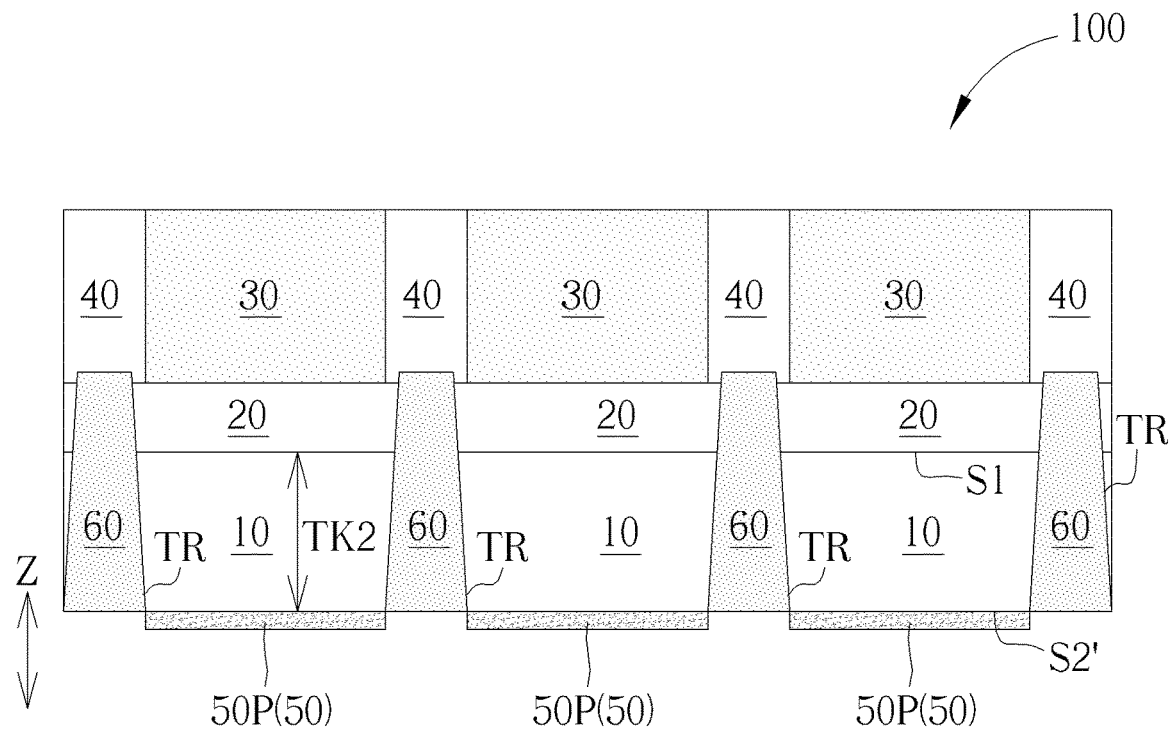
Figure 11:
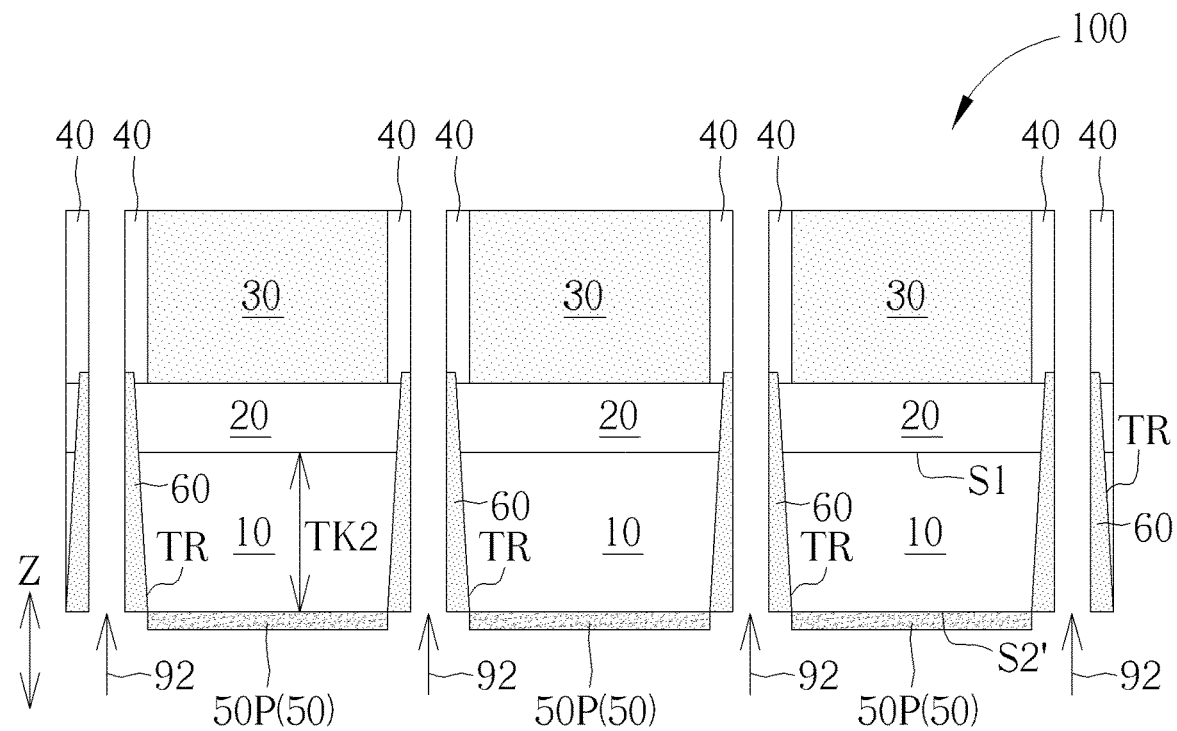

Please refer to FIG. 1 and FIGS. 6-11. FIGS. 6-11 are schematic drawings illustrating a manufacturing method of a semiconductor device according to a second embodiment of the present invention, wherein FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, FIG. 11 is a schematic drawing in a step subsequent to FIG. 10, and FIG. 6 may be regarded as a schematic drawing in a step subsequent to FIG. 1, but not limited thereto. As shown in FIG. 1 and FIG. 6, in some embodiments, the trench TR may penetrate through the substrate 10 and the gallium nitride layer 20 in the vertical direction Z, and a part of the trench TR may be located in the scribe line region 40. The depth DP of the trench TR in the vertical direction Z may be less than a thickness TK4 of the semiconductor structure 100 in the vertical direction Z, and the trench TR does not penetrate through the scribe line region 40 in the vertical direction Z. In some embodiments, the trench TR may be formed by forming a patterned mask layer (not illustrated) on the surface S2 of the substrate 10 and performing an etching process (such as but not limited to deep reactive ion etching, DRIE) using the patterned mask layer as an etching mask, and the patterned mask layer may be removed after the step of forming the trench TR.

Subsequently, as shown in FIG. 6 and FIG. 7, a molding compound material 60 may be formed. A portion of the molding compound material 60 may be formed on the surface S2 of the substrate 10, another portion of the molding compound material 60 may be formed in the trench TR, and the trench TR may be fully filled with the molding compound material 60. The molding compound material 60 may include a polymer-based material, a resin-based material, an epoxy material, benzocyclobutene (BCB), polyimide (PI), or other suitable molding compound materials. As shown in FIG. 8 and FIG. 9, after the step of forming the molding compound material 60, a thinning process 93 may be performed to the molding compound material 60 and the substrate 10 for reducing the thickness of the substrate 10 (the thickness TK1 of the substrate 10 shown in FIG. 8 may be reduced to be the thickness TK2 of the substrate 10 shown in FIG. 9, for instance) and removing the molding compound material 60 located outside the trench TR, and the surface S2 of the substrate 10 may become the surface S2' after the thinning process 93. In other words, after the thinning process 93, there may be not any molding compound material 60 on the backside surface of the substrate 10 (such as the surface S2'), and the molding compound material 60 may located within the trench TR only, but not limited thereto. In some embodiments, the thinning process 93 may include a thinning approach with chemical mechanical polishing, an etching back approach, or other suitable physical thinning approaches and/or chemical thinning approaches. It is worth noting that the purposes of thinning the substrate 10 and removing the molding compound material 60 outside the trench TR may be both achieved by the thinning process 93 for related process simplification and/or manufacturing cost reduction.

As shown in FIGS. 8-10, after the thinning process 93, the metal layer 50 may be formed on the surface S2' of the substrate 10. Therefore, the thinning process 93 may be performed after the step of forming the trench TR and before the step of forming the metal layer 50, and the molding compound material 60 may be formed before the step of forming the metal layer 50. In some embodiments, the metal layer 50 may include a plurality of metal patterns 50P separated from one another and disposed on the surface S2' of the substrate 10. Each of the metal patterns 50P may be disposed corresponding to one of the semiconductor device units 30 in the vertical direction Z, and the metal layer 50 may be separated from the molding compound material 60. In some embodiments, the metal patterns 50P may be formed by removing a part of the metal layer 50 (such as the metal layer 50 formed on the molding compound material 60) by a patterning process, but not limited thereto.

As shown in FIG. 10 and FIG. 11, after the step of forming the metal layer 50, the cutting process 92 may be performed to the semiconductor structure 100 for separating the semiconductor device units 30 from one another and forming a plurality of semiconductor devices including the semiconductor device unit 30, the gallium nitride layer 20, the substrate 10, the molding compound material 60, and a metal pattern 50P. The cutting process 92 may be performed at the site of the trench TR and/or the site of the scribe line region 40, and the negative influence of the cutting process 92 on the substrate 10 (such as warpage) may be improved and the negative influence of the cutting process 92 on the metal layer 50 formed on the surface S2' (such as the cracking issue and/or the peeling issue) may be improved by forming the trench TR, forming the molding compound material 60 in the trench TR, and forming the metal layer 50 outside the trench TR and separated from the molding compound material 60.

Figure 12:
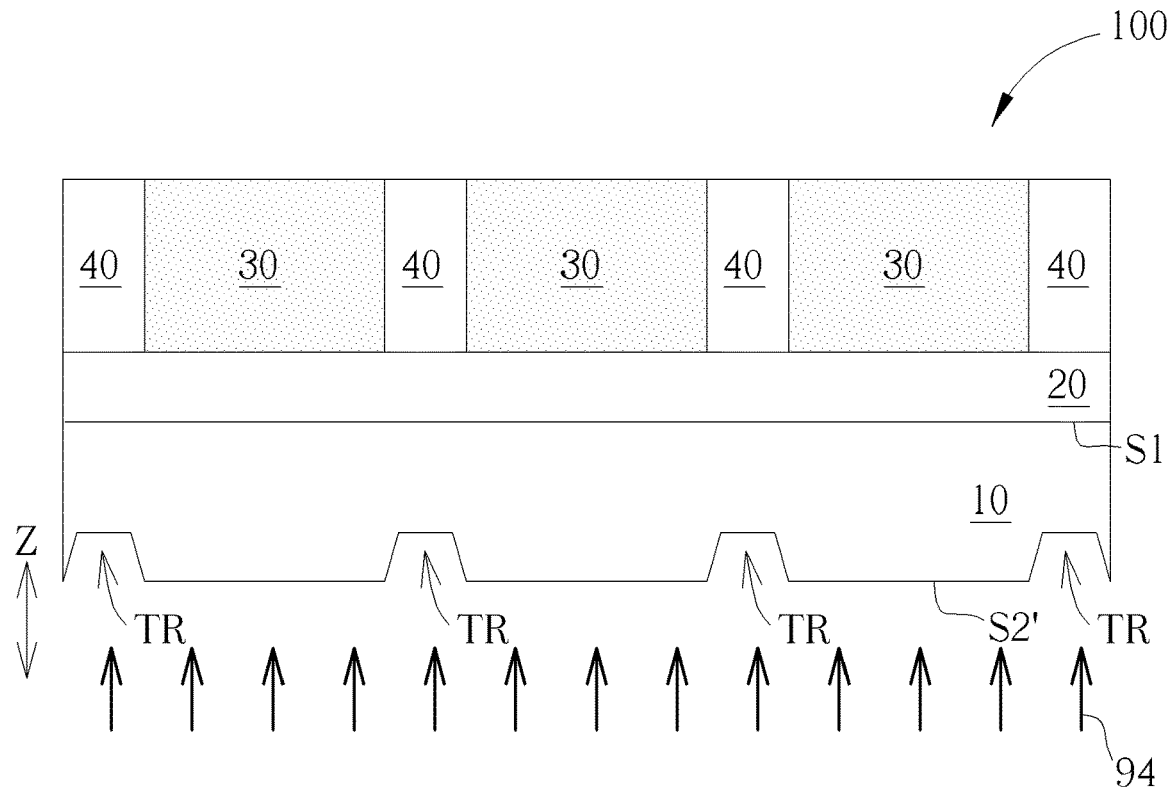
FIG. 12 is a schematic drawing illustrating a manufacturing method of a semiconductor device according to a third embodiment of the present invention.

Please refer to FIG. 3, FIG. 4, and FIG. 12. FIG. 12 is a schematic drawing illustrating a manufacturing method of a semiconductor device according to a third embodiment of the present invention. In some embodiments, FIG. 12 may be regarded as a schematic drawing in a step subsequent to FIG. 3, and FIG. 4 may be regarded as a schematic drawing in a step subsequent to FIG. 12, but not limited thereto. As shown in FIG. 3, FIG. 12, and FIG. 4, in some embodiments, an etching treatment 94 may be performed to the surface S2' of the substrate 10 after the step of forming the trench TR and before the step of forming the metal layer 50 for increasing the roughness of the surface S2 and the roughness of the surface inside the trench TR, and the adhesion of the metal layer 50 subsequently formed may be improved accordingly. The etching treatment 94 may include a suitable dry etching treatment and/or a suitable wet etching treatment, and the etching treatment 94 may be applied to other embodiments of the present invention (such as performing the etching treatment to the surface S2' of the substrate 10 after the state shown in FIG. 9 and before the state shown in FIG. 10) according to some design considerations.

To summarize the above descriptions, in the manufacturing method of the semiconductor device according to the present invention, the trench located corresponding to the scribe line region may be formed at the backside of the substrate before performing the cutting process, and the metal layer is formed on the backside of the substrate after the step of forming the trench and before the cutting process for improving the related problems of the cutting process and enhancing the manufacturing yield.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device, comprising:
providing a semiconductor structure, wherein the semiconductor structure comprises:
a substrate having a first surface and a second surface opposite to the first surface in a vertical direction;
a gallium nitride layer disposed on the first surface of the substrate;
semiconductor device units disposed on the gallium nitride layer; and
a scribe line region disposed on the gallium nitride layer and located between the semiconductor device units, wherein the scribe line region comprises an insulation material, and the scribe line region is sandwiched between the semiconductor device units in a horizontal direction perpendicular to the vertical direction;
forming a trench at the second surface of the substrate, wherein the trench is formed corresponding to the scribe line region in the vertical direction, and the trench penetrates through at least a part of the substrate in the vertical direction;
forming a metal layer on the substrate after the trench is formed;
performing a cutting process to the semiconductor structure after the metal layer is formed for separating the semiconductor device units from one another, wherein at least a part of the metal layer remains on the substrate after the cutting process, and a part of the scribe line region is removed by the cutting process; and
performing an etching treatment to the second surface of the substrate after the step of forming the trench and before the step of forming the metal layer for increasing a roughness of the second surface.

2. The manufacturing method of the semiconductor device according to claim 1, wherein a depth of the trench in the vertical direction is less than a thickness of the substrate in the vertical direction.

3. The manufacturing method of the semiconductor device according to claim 2, wherein a part of the metal layer is formed in the trench.

4. The manufacturing method of the semiconductor device according to claim 3, wherein a thickness of the metal layer is less than the depth of the trench in the vertical direction.

5. The manufacturing method of the semiconductor device according to claim 3, wherein the trench is not fully filled with the metal layer.

6. The manufacturing method of the semiconductor device according to claim 1, wherein the trench penetrates through the substrate and the gallium nitride layer in the vertical direction.

7. The manufacturing method of the semiconductor device according to claim 6, wherein a depth of the trench in the vertical direction is less than a thickness of the semiconductor structure in the vertical direction.

8. The manufacturing method of the semiconductor device according to claim 6, wherein a part of the trench is located in the scribe line region, and the trench does not penetrate through the scribe line region in the vertical direction.

9. The manufacturing method of the semiconductor device according to claim 6, further comprising:
forming a molding compound material in the trench before the step of forming the metal layer.

10. The manufacturing method of the semiconductor device according to claim 9, wherein the trench is filled with the molding compound material.

11. The manufacturing method of the semiconductor device according to claim 9, wherein the metal layer is separated from the molding compound material.

12. The manufacturing method of the semiconductor device according to claim 1, wherein the trench is formed by a laser treatment.

13. The manufacturing method of the semiconductor device according to claim 1, wherein the cutting process is performed at a site of the trench.

14. The manufacturing method of the semiconductor device according to claim 1, wherein the cutting process comprises a saw blade cutting approach or a laser cutting approach.

15. The manufacturing method of the semiconductor device according to claim 1, further comprising:
performing a thinning process to the substrate before the step of forming the trench for reducing a thickness of the substrate.

16. The manufacturing method of the semiconductor device according to claim 1, further comprising:
performing a thinning process to the substrate after the step of forming the trench and before the step of forming the metal layer for reducing a thickness of the substrate.

17. The manufacturing method of the semiconductor device according to claim 1, wherein the substrate is a silicon substrate.

18. The manufacturing method of the semiconductor device according to claim 1, wherein the gallium nitride layer is an un-doped gallium nitride layer.

19. The manufacturing method of the semiconductor device according to claim 1, wherein a bottom width of the trench is less than or equal to a width of the scribe line region.

* * * * *